US009065065B2

(12) United States Patent
Thompson

(10) Patent No.: US 9,065,065 B2
(45) Date of Patent: Jun. 23, 2015

(54) ENCAPSULATION FOR ORGANIC OPTOELECTRONIC DEVICES

(71) Applicant: Plextronics, Inc., Pittsburg, PA (US)

(72) Inventor: Glenn Thompson, Butler, PA (US)

(73) Assignee: SOLVAY USA, INC., Cranbury, NJ (US)

( * ) Notice: Subject to any disclaimer, the term of this patent is extended or adjusted under 35 U.S.C. 154(b) by 53 days.

(21) Appl. No.: 13/734,837

(22) Filed: Jan. 4, 2013

(65) Prior Publication Data

US 2013/0189805 A1  Jul. 25, 2013

Related U.S. Application Data

(62) Division of application No. 12/482,354, filed on Jun. 10, 2009, now Pat. No. 8,362,517.

(60) Provisional application No. 61/060,719, filed on Jun. 11, 2008, provisional application No. 61/090,150, filed on Aug. 19, 2008, provisional application No. 61/142,118, filed on Dec. 31, 2008.

(51) Int. Cl.
*H01L 51/44* (2006.01)
*H01L 51/56* (2006.01)
*H01L 51/50* (2006.01)
*H01L 51/52* (2006.01)

(52) U.S. Cl.
CPC ........... *H01L 51/448* (2013.01); *H01L 51/5036* (2013.01); *H01L 51/52* (2013.01); *H01L 51/5203* (2013.01); *H01L 51/5262* (2013.01); *H01L 51/5275* (2013.01); *Y02E 10/549* (2013.01); *H01L 51/56* (2013.01); *H01L 51/524* (2013.01); *H01L 51/5259* (2013.01)

(58) Field of Classification Search
CPC ..... H01L 51/50; H01L 51/56; H01L 51/5237; H01L 51/524; H01L 51/5243; H01L 51/5246; H01L 51/5259; H05B 33/0896; G09G 3/3208
See application file for complete search history.

(56) References Cited

U.S. PATENT DOCUMENTS

| 2,921,244 | A |   | 1/1960 | Pretzfeld |
| 5,657,811 | A | * | 8/1997 | Cook ............................... 164/97 |
| 6,080,031 | A | * | 6/2000 | Rogers et al. .................... 445/25 |

(Continued)

FOREIGN PATENT DOCUMENTS

| JP | 2007-258434 A | 10/2007 |
| WO | WO-98/53644 A | 11/1998 |

(Continued)

OTHER PUBLICATIONS

Encyclopedia of Packaging Technology, Brody & March, Eds., Wiley, 8 pages, Table of Contents, (1997).

(Continued)

*Primary Examiner* — Michael Lebentritt
*Assistant Examiner* — Jordan Klein
(74) *Attorney, Agent, or Firm* — The Marbury Law Group, PLLC

(57) ABSTRACT

An organic optoelectronic device includes a substrate, an anode, a cathode, an active region comprising an organic material, an encapsulation that isolates the active region from an ambient environment, wherein the encapsulation comprises a housing, and a first hermetically sealed electrical path through the housing.

2 Claims, 12 Drawing Sheets

(56) References Cited

U.S. PATENT DOCUMENTS

| | | | |
|---|---|---|---|
| 6,682,175 | B2 | 1/2004 | Otsuka et al. |
| 2001/0013756 | A1* | 8/2001 | Mori et al. .................... 313/512 |
| 2002/0068191 | A1 | 6/2002 | Kobayashi |
| 2002/0101154 | A1 | 8/2002 | Seo et al. |
| 2003/0080678 | A1 | 5/2003 | Kim et al. |
| 2003/0137061 | A1* | 7/2003 | Bailey et al. .................. 257/787 |
| 2004/0135874 | A1 | 7/2004 | Oehlbeck et al. |
| 2004/0195967 | A1 | 10/2004 | Padiyath et al. |
| 2006/0128042 | A1* | 6/2006 | Gramann et al. ............... 438/26 |
| 2006/0175582 | A1 | 8/2006 | Hammond et al. |
| 2006/0278965 | A1* | 12/2006 | Foust et al. ................... 257/678 |
| 2007/0065590 | A1 | 3/2007 | Williams et al. |
| 2008/0061683 | A1 | 3/2008 | Bertram |
| 2008/0080163 | A1* | 4/2008 | Grote, III et al. ............... 362/23 |
| 2008/0210455 | A1 | 9/2008 | Pollack et al. |
| 2008/0248313 | A1 | 10/2008 | Seshadri et al. |
| 2008/0299293 | A1 | 12/2008 | Sheina et al. |
| 2008/0315751 | A1 | 12/2008 | Sheina et al. |

FOREIGN PATENT DOCUMENTS

| | | | |
|---|---|---|---|
| WO | WO-2005/104266 | A | 11/2005 |
| WO | WO-2006/107379 | A | 10/2006 |
| WO | WO-2007/064115 | A1 | 6/2007 |

OTHER PUBLICATIONS

Fundamentals of Packaging Technology, Soroka, 3rd Ed., 12 pages, Table of Contents, (2002).

Hebner et al., "Ink-jet printing of doped polymers for organic light emitting devices," Appl. Phys. Letts., vol. 72, No. 5, pp. 519-521 (1998).

International Search Report and Written Opinion for Application No. PCT/US2009/046955, mail date Sep. 16, 2009, 15 pages.

Li, Z. et al., "Organic Light-Emitting Materials and Devices", Optical Science and Engineering Series, CRC Taylor & Franics, (Table of Contents), 2 pages (Sep. 12, 2006).

Notice of Allowance for U.S. Appl. No. 12/482,354, mail date Sep. 21, 2012, 7 pages.

Office Action for U.S. Appl. No. 12/482,354, mail date Aug. 9, 2011, 16 pages.

Office Action for U.S. Appl. No. 12/482,354, mail date May 24, 2012, 22 pages.

Organic Light-Emitting Materials and Devices, "Organic Photovoltaics: Mechanisms, Materials, and Devices," Sun & Sariciffci, Eds., CRC Press, 5 pages, Table of Contents, (2005).

* cited by examiner

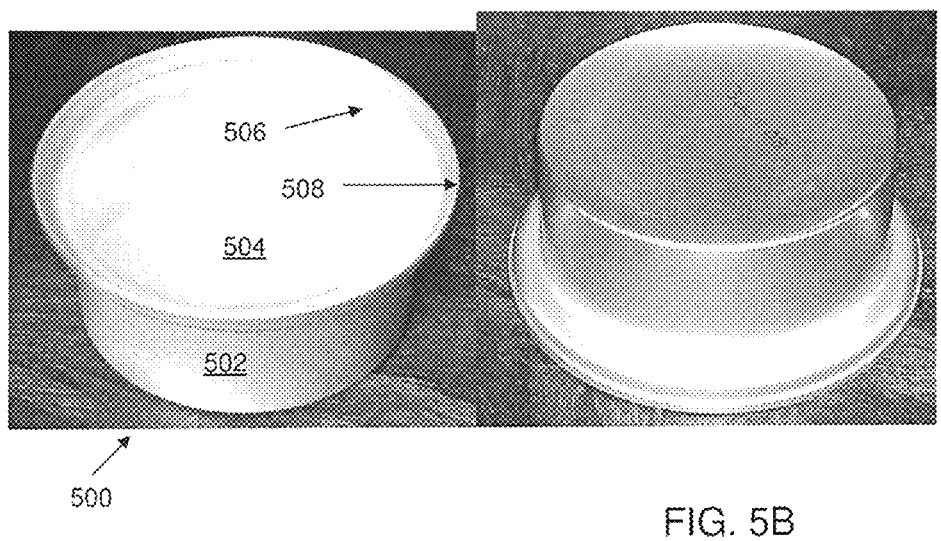
FIG. 5A
FIG. 5B
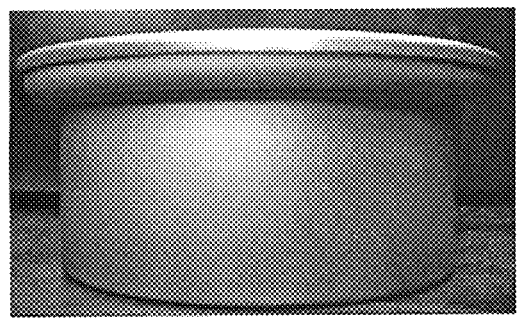
FIG. 5C
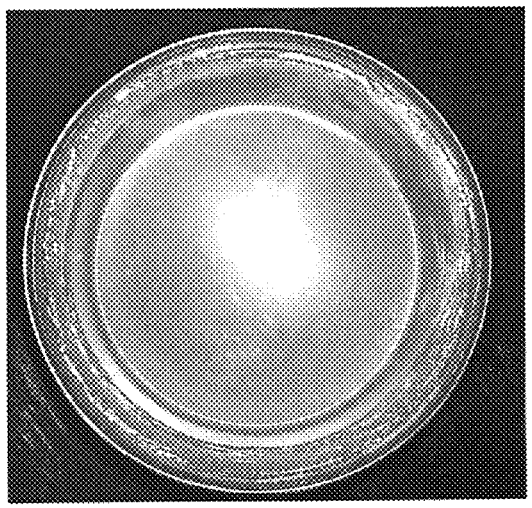
FIG. 5D

ENCAPSULATION FOR ORGANIC OPTOELECTRONIC DEVICES

CROSS-REFERENCE TO RELATED APPLICATIONS

This application is a divisional application of U.S. patent application Ser. No. 12/482,354, filed Jun. 10, 2009 which claims priority to U.S. Provisional Patent Application No. 61/060,719, filed on Jun. 11, 2008, U.S. Provisional Patent Application No. 61/090,150, filed on Aug. 19, 2008, and U.S. Provisional Patent Application No. 61/142,118, filed on Dec. 31, 2008. The disclosures of each of hese applications are hereb incorporated b reference in their entireties.

BACKGROUND

Organic optoelectronic devices can utilize organic small molecules or polymers for conversion between light and electricity. For example, when transferred into their excited state by an external power source, organic active materials can produce light, therefore realizing an organic light emitting diode (OLED). On the other hand, active layers of organic photovoltaic (OPV) devices can utilize organic small molecules or polymers that produce energy upon exposure to light.

OLED devices may be referred to as polymer light emitting diode (PLED) devices or small molecule organic light emitting diode (SMOLED) devices depending on their active compositions. Earlier OLEDs were typically based on relatively simple structures, where a thin layer of the electroluminescence (EL) conjugated polymer was enclosed between a pair of electrodes. When a voltage is applied to the electrodes, the positive (anode) and the negative (cathode) electrodes can provide injection of holes and electrons, respectively, into the EL polymer. In the EL polymer layer, electrons and holes move towards each other in the applied electrical field and form excitons, which are bound excited states that can relax down into the ground state radiatively by emitting a photon. This process can be referred to as electroluminescence. ORGANIC OPTOELECTRONIC devices are of interest in, for example, display, signage, and lighting.

OLEDs were first designed in the 1980s. See, e.g., C. W. Tang, S. A. Van Slyke, Organic electroluminescent diodes, *Appl. Phys. Lett.* 1987, 51, 913. More recent developments in OLED materials and applications are generally described in Kraft et al., Angew. Chem. Int. Ed., 1998, 37, 402-428; and also in Z., Li and H. Meng, Organic Light-Emitting Materials and Devices (Optical Science and Engineering Series), CRC Taylor & Francis (Sep. 12, 2006). The disclosures of these references are incorporated by reference in their entirety.

In OPVs, the active layer can comprise a component that carries positive charge (or "holes") and a second component that carries negative charge (or electrons), and a junction between the two components. The junction allows or facilitates the conversion of light to electricity. The electric charges can be collected by electrodes on each side of the device and can be used to used as a standalone power source or be connected to a power grid. In the photovoltaic device, one side of the active layer is typically transparent to allow light through to the active layer. The opposite side can have reflective elements to reflect light back to the active layer. Photovoltaic devices are important clean energy sources.

SUMMARY

Described herein are embodiments which include, among other things, devices, articles, instruments, apparatuses, kits, systems, and the like, and methods of making and methods of using same. More specifically, various embodiments disclosed herein relate to organic optoelectronic devices. In particular, embodiments can relate to encapsulation and packaging of such devices.

In one aspect, an organic optoelectronic device is provided. The device includes a substrate, an anode, a cathode, an active region including an organic material, an encapsulation that isolates the active region from an ambient environment, wherein the encapsulation includes a housing, and a first hermetically sealed electrical path through the housing. In this embodiment, the housing is bonded to the substrate on a substrate side opposite the side of the anode, cathode, and active region.

In another aspect, a method of manufacturing an organic optoelectronic device is provided. The method includes providing a chip comprising a substrate, an anode, a cathode, an active region including an organic material, and a housing, substantially enclosing an edge of the chip with the housing, and sealing the housing with the chip using a first barrier material thereby forming an encapsulation that isolates the active region from an ambient environment. The barrier can be, for example, a sealant known in the art that is substantially impervious to oxygen and water vapor.

In another aspect, a system including a plurality of organic optoelectronic devices is provided. Each of the optoelectronic devices includes a substrate, an anode, a cathode, an active region comprising an organic material, wherein the active region is electrically coupled to the anode and the cathode, an encapsulation that isolates the active region from an ambient environment, wherein the encapsulation comprises a housing, and a first hermetically sealed electrical path through the housing. The housing is bonded to the substrate on a substrate side opposite the side of the anode, cathode, and active region.

At least one advantage from at least one embodiment is that the encapsulation utilizes technologies based on known materials and manufacturing method, and thus is of low cost and can be produced in large quantities.

At least another advantage from at least one embodiment is that the encapsulation leaves few areas, if any, for oxygen and water vapor to permeate therethrough to come in contact with the organic active materials, thereby expanding the lifetime of the devices.

At least another advantage from at least one embodiment is that the encapsulation allows the organic optoelectronic devices to be standalone devices.

BRIEF DESCRIPTION OF FIGURES

FIG. 5A is a top perspective view of a working example of a housing used in the encapsulation;

FIG. 5B is a bottom perspective view of the housing;

FIG. 5C is a side view of the housing;

FIG. 5D is a top plan view of the housing;

FIG. 6C is a cross-sectional view of an example electrical feed-through;

DETAILED DESCRIPTION

Introduction

The use of organic materials in OPV devices and in organic optoelectronic devices offers several desirable properties, for example, increased efficiency of the device; ease of processability of materials and components during device fabrication; the ability to use spin casting, drop casting, and printing techniques to apply different layers in the devices; the ability to prepare flexible devices; the ability to prepare low-weight devices; and the ability to prepare low-cost devices.

OPV devices are generally described in, for example, Sun and Sariciftci (Eds), *Organic Photovoltaics, Mechanisms, Materials, and Devices,* 2005, CRC Press.

Organic light emitting devices are described in, for example, Z., Li and H. Meng, Organic Light-Emitting Materials and Devices (Optical Science and Engineering Series), 2007.

All references cited in this application are hereby incorporated by reference in their entirety.

Example Organic Optoelectronic Devices

Figure 1:
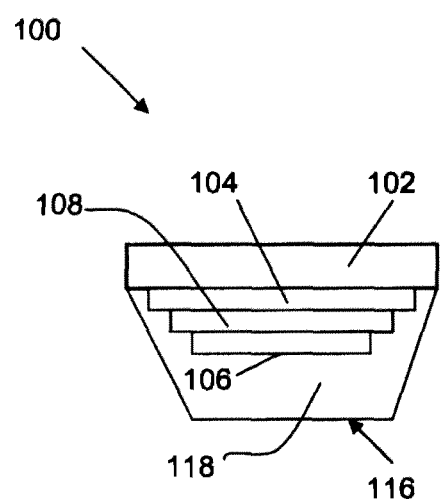
FIG. 1 is a cross-sectional diagram of an example organic optoelectronic device.

An example organic optoelectronic device 100 is illustrated in FIG. 1. The device 100 can comprise a substrate 102, an anode 104, a cathode 106, and an active region 108. The active region 108 comprises an organic material, and is electrically coupled to the anode 104 and the cathode 106.

The organic optoelectronic device 100 also can have an encapsulation 116 that isolates the active region 108 from an ambient environment. In particular, the encapsulation 116 prevents water vapor and oxygen from entering the cavity 118 to interact with the organic material in the active region 108. The cavity 118 can be filled with a gas such as an inert gas (e.g., argon), can have a desiccant disposed therein, or can be filled with a nongaseous fill material that is in contact with the cathode. The nongaseous material can include, for example, a desiccant, a getter, or can simply be an insulating material that fills up the cavity.

The substrate 102 or the encapsulation 116 can be transparent to light of certain wavelengths.

The early relatively simple devices were not particularly efficient. As the organic optoelectronic technology evolved, better understanding of the electrode/polymer interfaces has led to the development of new, more advanced and efficient devices. In particular, hole injection and/or hole transport materials forming a layer between one electrode and the electroluminescent material can improve the efficiency of the device. Thus, hole injection layers (HIL) or hole transport layers (HTL) are often used in OLED structures.

Figure 2A:
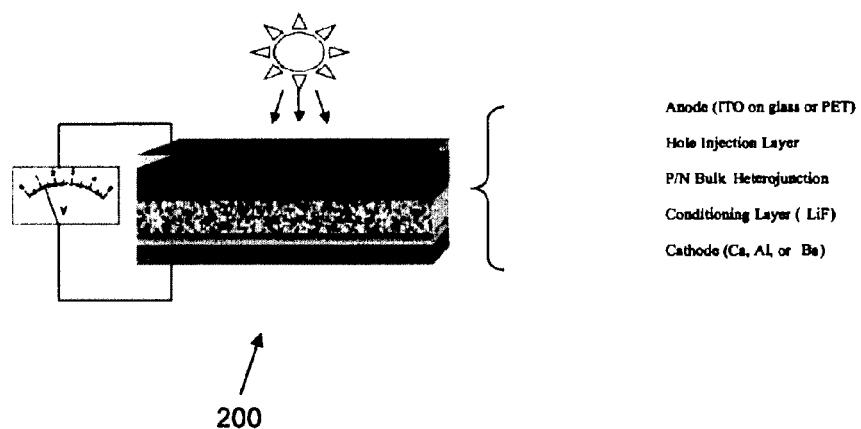
FIG. 2A is a schematic diagram of a typical OPV device.
Figure 2B:
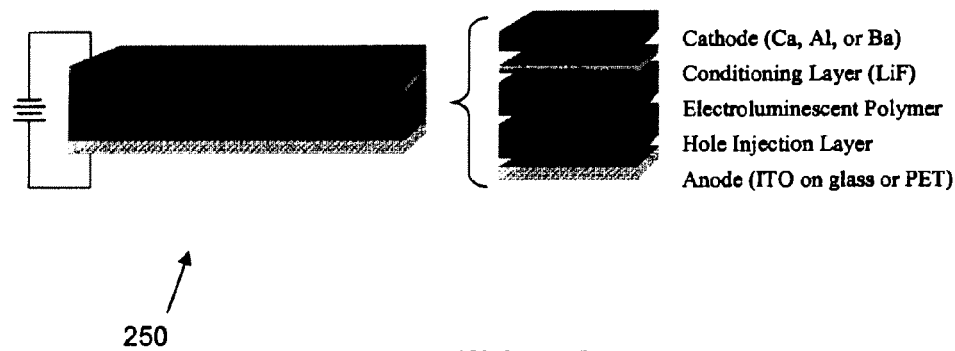
FIG. 2B is a schematic diagram of a typical OLED device.

FIGS. 2A and 2B illustrate a typical OPV device 200, and a typical OLED device 250, respectively. The OPV device 200 can comprise an anode composed of ITO on glass or PET, a hole injection layer (HIL), a P/N junction formed with an organic active material, a conditioning layer composed of LiF, and a cathode composed of Ca, Al, or Ba. Similarly, OLED devices can comprise, for example, multi-layer structures including for example an anode such as ITO on glass or PET or PEN; a hole injection layer; an electroluminescent layer such as a polymer layer; a conditioning layer such as LiF, and a cathode composed of, for example, Ca, Al, or Ba.

Additional layer and materials technology pertaining to organic electronic devices, including HIL and HTL technology, is described in, for example, U.S. application Ser. No. 11/826,394 filed Jul. 13, 2007, U.S. application Ser. No. 11/496,024 filed Jul. 31, 2006 (Latent Doping of Conducting Polymers), U.S. application Ser. No. 12/113,058 filed Apr. 30, 2008 (Solvent System for Conjugated Polymers), U.S. application Ser. No. 11/350,271 filed Feb. 9, 2006 (Hole Injection Layer Compositions), U.S. application Ser. No. 12/153,181 filed May 14, 2008 (Aryl-substituted conjugated polymers related applications), U.S. provisional application No. 60/960,851 filed Oct. 16, 2007 (Organic Electrodes and Electronic Devices), U.S. provisional application No. 61/029,255 filed Feb. 15, 2008 (Novel Compositions, Methods, and Polymers), U.S. provisional application No. 61/032,905 filed Feb. 29, 2008 (Planarizing Agents and Devices), and U.S. provisional application No. 61/043,654 filed May 13, 2008 (Hole Injection Layer Compositions and Photovoltaic Devices), and are incorporated herein by reference including the summary sections, the claims, the figures, and working examples.

More layers may be included in an organic optoelectronic device to improve the light emitting efficiency. For example, an organic optoelectronic device may comprise an anode which includes an ITO layer disposed on glass or polyethylene terephthalate (PET), a hole injection layer, an active layer, an electron transport layer, and a cathode.

The active region may comprise an electroluminescent polymer disposed as at least one emissive layer, which may be formed by a solution-based process such as ink jet printing, screen printing, or vapor deposition processes.

The hole injection layer may comprise an inherently conductive polymer. For example, the hole injection layer may comprise a substituted poly-thiophene, a regio-regular substituted poly-thiophene, or a regio-regular substituted poly-3-thiophene. When a regio-regular substituted poly-thiophene is used, at least one planarizing agent may be included. The planarizing agent may be selected from, for example, polyvinyl alcohol (PVOH), or derivatives thereof. The planarizing agent helps planarizing the interface between layers thereby facilitating the transfer of holes across the interface. The planarizing agent can also help to reduce the optical absorbance, thereby increasing the light output efficiency.

The hole injection layer may also be formed by a solution based, or by vapor deposition processes. For example, the hole injection layer may be formed by spin casting, drop casting, dip-coating, spray-coating, or by printing methods such as ink jet printing, off-set printing, or by a transfer process. For example, ink jet printing is described in U.S. Pat. No. 6,682,175 to Otsuka, and in Hebner et al., Applied Physics Letters, 72, no. 5, Feb. 2, 1998, pages 519-521, the disclosures of which are hereby incorporated by reference in their entirety.

The hole injection layer can be provided that is about 10 nm to about 50 μm in thickness with typical thickness ranging from about 50 nm to about 1 μm. In another embodiment, thickness can be about 10 nm to about 500 nm, and more particularly, about 10 nm to about 100 nm.

Similarly, the electron transport layer may be formed by a solution-based process, or by vapor deposition processes.

Other layers, such as an electron injecting layer, a hole blocking layer, or an electron blocking layer may also be included. The resulting device would comprise an anode, a hole injection layer, a hole transport layer, an electron blocking layer, an active region such as one or more light emitting layers, a hole blocking layer, an electron transport layer, an electron injection layer, and a cathode. The hole transport layer and the electron transport layer facilitate transportation of electrons and holes, respectively, into the active region, while the electron and hole blocking layers prevent electrons or holes leaving the active region.

Examples for materials used for the different layers include:

1) Hole injection layer: PEDOT (poly(3,4-ethylenedioxythiophene)):PSS (polystyrenesulfonic acid), Plexcore OC, LG101 (Hexaazatriphenylene hexanitrile), MeO-TPD ([1,1'-Biphenyl]-4,4'-diamine, N4,N4'-bis(4-methoxyphenyl)-N4,N4'-diphenyl-benzidine): F4TCNQ (N4,N4'-diphenyl-benzidine);
2) Electron injection layer: Li (lithium), Ca (Calcium), Ba (Barium), LiF (Lithium Fluoride), CsCO3 (Cesium Carbonate), Ca(acac) (calcium acetylacetonate), Li:BPhen (Lithium:Bathophenanthroline(4,7-Diphenyl-1,10-phenanthroline)), Cs:BPhen (Cesium:Bathophenanthroline(4,7-Diphenyl-1,10-phenanthro line));
3) Hole transport layer: TPD, NPB (1,4-bis(1-naphthylphenylamino)biphenyl), Polymeric versions of TPD or other benzidines, PFO (poly(fluorene-oxadiazole)), TFB (poly(2,7-(9,9-di-n-octyfluorene)-(1,4-phenylene-((4-secbutylphenyl)imino)-1,4-phenylene))), PPV (poly(1,4-phenylene vinylene);
4) Electron transport layer: Alq3 (Tris-(8-hydroxyquinolino)aluminum), Lithium quinoline, OXd-7 (2,2'-(1,3-Phenylene)bis[5-[4-(1,1-dimethylethyl)phenyl]]-1,3,4-Oxadiazole), TAZ (3,5-Bis(4-tert-butyl-phenyl)-4-phenyl-triazole);
5) Hole blocking layer: BCP (2,9-dimethyl-4,7-diphenyl-1,10-phenanthroline), BPhen, OXD-7, TAZ;
6) Electron blocking layer: TCTA (4,4',4"-Tris(carbazol-9-yl)-triphenylamine), Spiro-TAD (2,2',7,7'-Tetrakis(n,n-diphenylamino)-9,9'-spirobifluorene); and
7) Light emitting layer: Polyfluorene family, PPV family, co-deposited small molecule films such as Ir(ppy)3 (Tris [2-(2-pyridinyl)phenyl-C,N]-iridium (III)) in CBP (4,4'-Bis(carbazol-9-yl)-biphenyl).

Substrate

Substrates are generally known in the art for organic electronic devices including OLEDs and OPVs. Descriptions of various substrates may be found in, for example, Z., Li and H. Meng, Organic Light-Emitting Materials and Devices (Optical Science and Engineering Series), 2007. In FIG. 1, for example, the substrate 102 of the organic optoelectronic device 100 can be, for example, a solid substrate or a flexible substrate. The substrate can comprise, for example, an inorganic material or an organic material. The substrate can be, for example, made from glass or plastic. The substrate can be, for example, flat or curved. The substrate can be, for example, transparent, translucent, or opaque.

Anode

Anodes are generally known in the art for organic electronic devices including OLEDs and OPVs. In FIG. 1, for example, the anode 104 of the device 100 can be transparent to, for example, the light emitted from the device 100, or ambient light interacting with the active region 108. The anode 104 may comprise, for example, indium tin oxide (ITO). ITO in the form of thin layers (e.g., about 100 nm thick) is substantially transparent to visible light. ITO has a relatively high work function that helps the injection of holes into the active region 108. The ITO may be coated on a substrate comprising, for example, glass, plastic, ZnO, or NiO.

Cathode

Cathodes are generally known in the art for organic electronic devices including OLEDs and OPVs. In FIG. 1, for example, the cathode 106 of the device 100 can also be transparent. The cathode 106 may comprise, for example, a thin metal film such as aluminum or calcium, or a non-metal conductive layer. The cathode 106 may comprise a layer which is a combination of organic and inorganic components. The cathode 106 typically has a relatively low work function to help injecting electrons into the active region 108. The cathode 106 can be, for example, 100-200 nm thick.

Active Region

The active region refers generally to the region where conversions between light and electricity occur. For example, electrons and holes can recombine to radiate photons, or conversely photons can produce electron-hole pairs.

In some embodiments, the active region comprises an organic material, and the photon energy may correspond to the energy difference between the lowest unoccupied molecular orbital (LUMO) level and the highest occupied molecular orbital (HOMO) level of the organic material.

The active region can comprise multiple layers, for example, a combination of p- and n-type layers. The p- and n-type materials may be bonded to each other. The bonding can be ionic or covalent bonding. The multiple layers of the active region may form heterostructures therebetween.

The active region may be manufactured by known methods including, for example, spin casting, drop casting, vapor deposition or sputtering, crystalline growth, patterned etching, dip coating, or by printing techniques such as ink jet printing, off-setting, transfer processes, or by spray applications.

OLED Emissive Layer

The organic material in the active region 108 (FIG. 1) may include an electroluminescent polymer. The polymer may be a fluorescent emitter, or a phosphorescent emitter. The polymer may include, for example, poly-phenylene vinylene, or polyfluorene. The polymers are often engineered to substitute side chains onto the backbone to tune the color or to improve the processing of the polymers.

Alternative to a polymer emitter, a small molecule emitter comprising for example, organo-metallic chelates or conjugated dendrimers, and the like, which are known in the art, can be used in conjunction with the embodiments described herein.

Encapsulation

The device may be already packaged in an encapsulation that protects the organic material of the device from the ambient environment. The resulting device may thus be a standalone device that can be readily installed in a system which does not necessarily provide oxygen and water vapor barriers.

Conventional technologies already provide encapsulations that are non-permeable to oxygen and water vapor. These encapsulations may include, for example, aluminum cans, glass jars, and plastic bottles that protect food and drinks. In some embodiments, many of these conventional technologies are adapted to provide reliable and low-cost encapsulations for organic optoelectronic devices.

Figure 3:
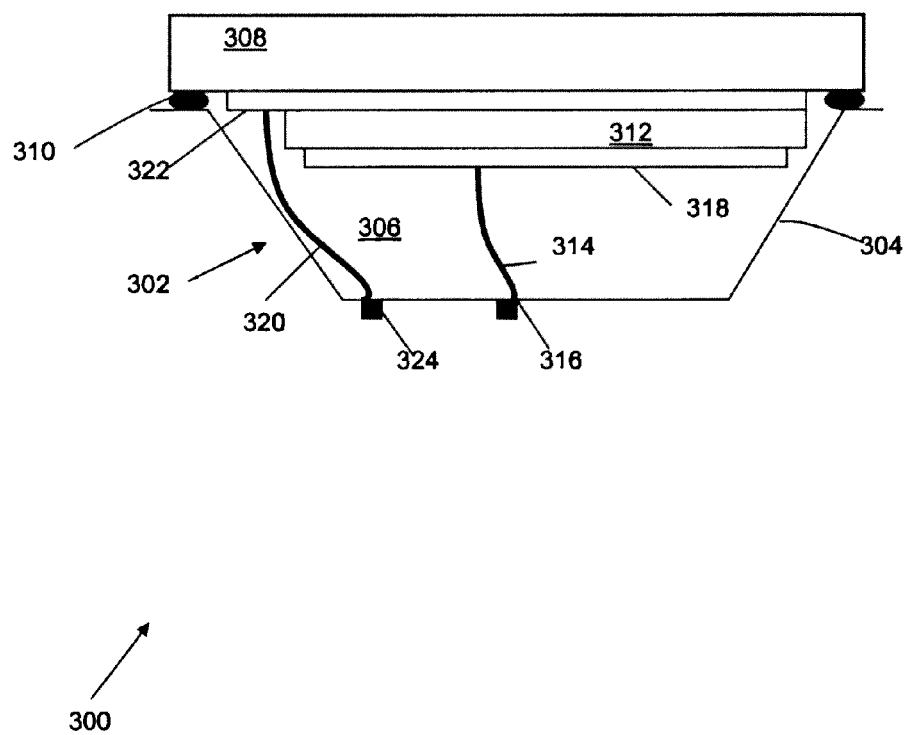
FIG. 3 is a cross-sectional view of an example device packaged in an encapsulation.

An encapsulation 302 of a device 300 is illustrated in FIG. 3. The encapsulation 302 comprises a housing 304 forming a cavity 306 with the substrate 308. A first sealant 310 is disposed between the housing 304 and the substrate 308, and forms an oxygen and water vapor barrier for the active region 312. The first sealant comprises, for example, mylar coated with metal, or epoxy based adhesives, etc. The first sealant can be selected to be conductive, or non-conductive, depending on whether the housing 304 needs to be electrically coupled to the active region 312.

The housing may have a first electrically conductive path 314 disposed in a first hermetic seal 316 through the housing 304. The first electrically conductive path 314 may be electrically coupled to the cathode 318.

The housing 304 may further have a second electrically conductive path 320 through the housing 304 via a second hermetic seal 324. The second electrically conductive path 320 may be electrically coupled to the anode 322. In this case, the housing 304 may comprise a non-conductive material.

In another embodiment, the housing 304 may be electrically conductive. For example, the housing 304 may comprise a metal, such as aluminum, or a conductive plastic. In this case, the first electrically conductive path 314 is electrically isolated from the housing 304. Instead of using the second electrically conductive path 320 through the housing 304, the anode 322 may be electrically coupled to the housing 304 through the first sealant 310 which in this case is conductive.

The electrically conductive housing 304 may thus form a common anode with neighboring devices.

Housing

Figure 4A:
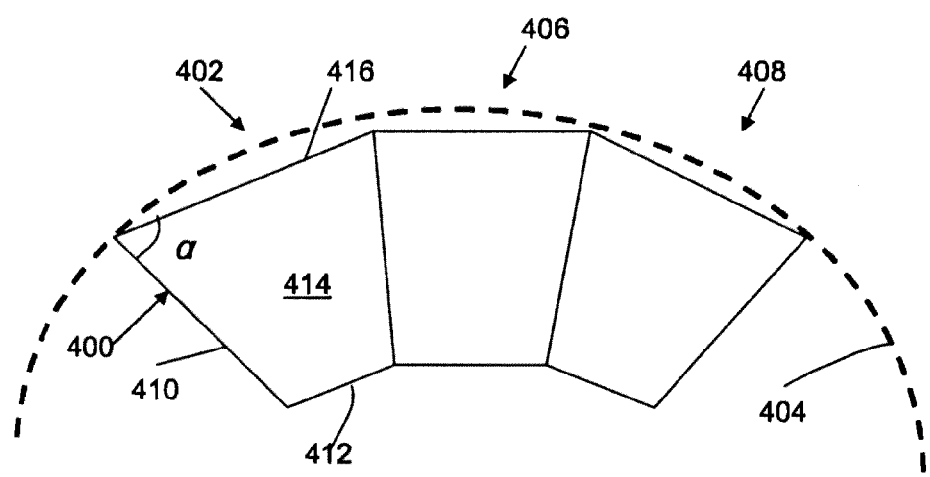
FIG. 4A is a cross-sectional view of a plurality of example packaged organic optoelectronic devices tightly arranged on a curved surface.

As shown in FIG. 4A, the housing 400 has a contoured shape that allows the organic optoelectronic 402 to be arranged on a curved surface 404 with a plurality of neighboring devices 406, 408 without causing substantial interference between housings of neighboring devices.

In one embodiment, the housing 400 has a slanted side wall 410 and a bottom wall 412, and wherein a slant angle α of the slanted side wall 410 is selected such that, when the device 402 is tightly arranged with a plurality of neighboring devices 406, 408 on the curved surface 404, housings of neighboring devices do not substantially interfere with each other. For example, when the slant angle α is about 60°, two neighboring devices 402, 406 may be arranged on a curved surface 404 with such a curvature that the devices 402, 406 form an inward angle of about 120°, while the neighboring sidewalls do not exert pressure on each other. In some embodiments, the slant angle α is in the range between about 30° and 90°.

The cavity 414 formed between the housing 400 and the device substrate 416 may be filled with an inert gas, such as argon, at a pressure higher than an atmospheric pressure. This further helps prevent oxygen and water vapor from entering the cavity 414. For example, the pressure may be between about 1.05 and 1.5 times the atmospheric pressure. The strength of the housing material and the active region material determines how high the pressure can be. In a preferred embodiment, the pressure is about 1.1 times the atmospheric pressure.

Figure 4B:
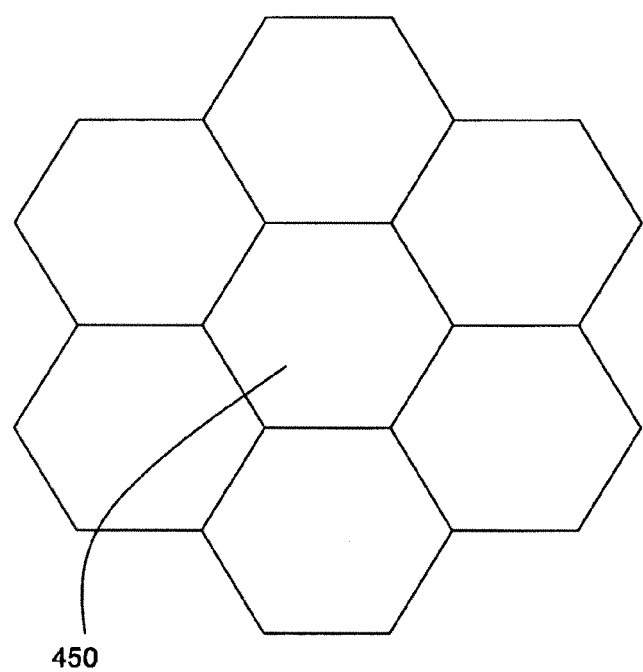
FIG. 4B is a top plan view of a plurality of example hexagonal organic optoelectronic devices tightly arranged into a matrix.

In the top plan view, the housing 400 has a shape configured to improve the fill factor, i.e., the ratio between the light emitting area and the total area, of the organic optoelectronic device. The shape of the housing 400 in the top plan view may be a circle, an oval, or polygonal. In one exemplary embodiment, the housing may have a substantially hexagon shape in the top plan view as shown in FIG. 4B. Thus, the device 450 is configured to be neighboring six other polygonal devices to form a tightly arranged matrix.

The housing 400 may be coated with a color or is labeled with a symbol indicative of a light emission color of the active region.

In some embodiments, the housing may comprise transparent plastic to allow light to pass therethrough. The housing may also be made of glass. The glass housing may be manufactured in a certain shape to improve light out coupling.

Aluminum Housing Embodiment

An example housing 500 composed of aluminum is illustrated in FIGS. 5A-5D. The housing 500 has a side wall 502, a bottom wall 504, a seat portion 506 for supporting a chip or a substrate, and an edge portion 508 that can be bent to substantially enclose and lock an edge of the chip. In the embodiment shown, the housing 500 can be unitarily formed. As discussed below, the unitarily formed housing 500 including the bendable edge portion 508 can be advantageously used to form a hermetic seal with a chip or a glass substrate. Technologies from food packaging industry and auto industry can be adapted to form such hermetic seals.

The aluminum is reflective to light, and thus can increase the efficiency of the device by reflecting light back toward the active region. When other less reflective materials are used for the housing, the inner bottom surface of the housing may be coated with a reflective layer to improve the device efficiency.

Housing Roll Crimp

An embodiment is shown, wherein the housing is bonded to the substrate on a substrate side opposite the side of the anode, cathode, and active region.

Figure 6A:
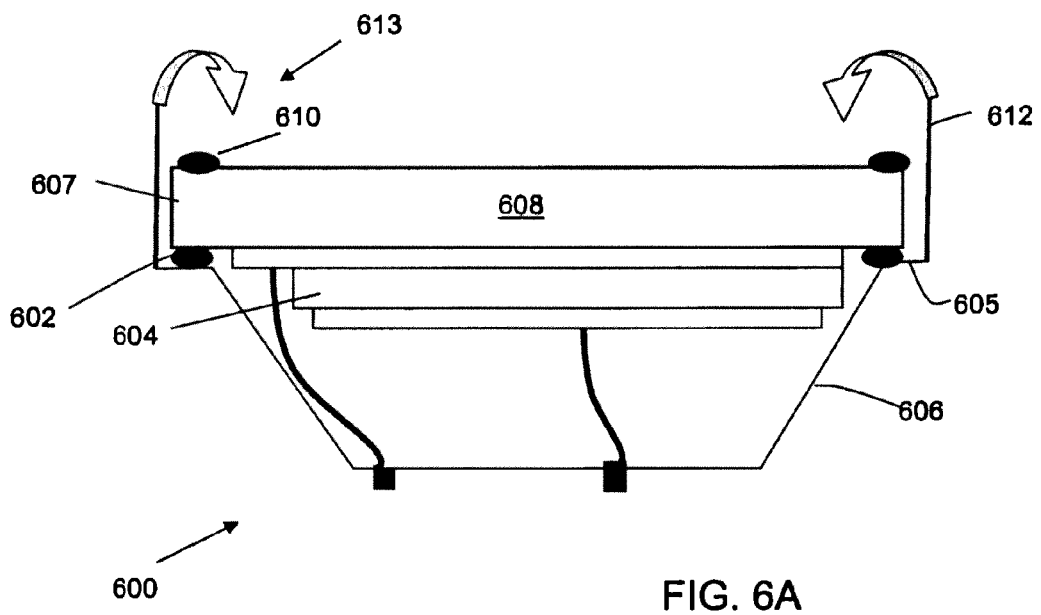
FIGS. 6A and 6B are cross-sectional views of a further sealed example device.

For example, as shown in FIG. 6A, device 600 has a first barrier material, such as a sealant 602 configured to form an oxygen and water vapor barrier for the active region 604. The first barrier material 602 is disposed between the housing 606 and a first side of the substrate 608, wherein the substrate 608 sits on the seat portion 605 of the housing 606.

The organic optoelectronic device 600 may further include a second barrier material 610 disposed on a second side of the substrate 608 opposite the first side. The second barrier material can comprise a sealant, or a getter material that absorbs water vapor. Getter materials can also be disposed in the cavity to absorb water vapor in the cavity.

Figure 6B:
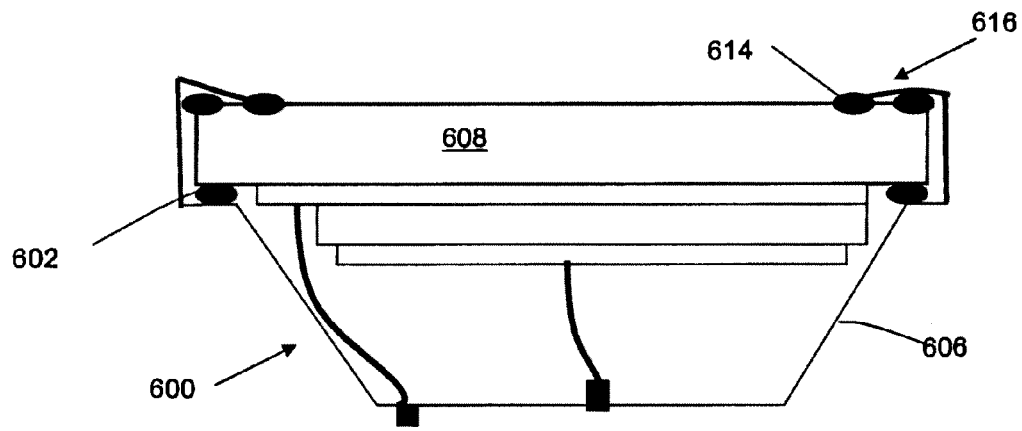

An edge portion 612 of the housing 606 may then be bent, forming a bent portion, or "roll crimp" 613 over the second barrier material 610, thereby substantially enclosing an edge 607 of the substrate 608. The edge portion 612 and/or the bent portion 616 of the housing 606 can be in contact with the second barrier material 610, as illustrated in FIG. 6B, thereby forming the second seal that further prevents oxygen and water vapor from entering the cavity.

The second barrier material 610 can comprise an elastic material, such as rubber. The bent portion 616 can apply a clamping force over the edge of the chip or substrate and the second barrier material 610. A clamping force can also be applied over the first barrier material 602. By selecting the material of the housing 606, the clamping force can remain after the bent portion or roll crimp 616 is formed, thereby forming two hermetic seals with the first and second barriers. The technologies or forming similar hermetic seals between metal and glass are known in many industries. For example, in food packaging industry, hermetic seals, which can be formed between a metal cap and a glass container through a rubber O-ring, are used to preserve canned food. In auto industry, hermetic seals are used between a glass windshield and a metal frame of a car. These technologies are adapted to form reliable and low cost hermetic seals for organic optoelectronic devices in accordance with embodiments described herein.

A third barrier material 614 may further be applied to seal off a gap between the substrate 608 and the bent portion (roll crimp) 616. The multiple seals improve the sealing of the active region 604, and thus increase the lifespan of the active region 604.

The packaging of the devices may be performed before or after dicing of a large substrate. In the case of before dicing, individual housings may be patterned corresponding to the individual active regions on the large substrate, and are subsequently sealed, and the individual devices then diced. In the case that the individual regions are already diced from the substrate, both the dices and the housings are patterned correspondingly and then sealed together.

Production methods known in the art for packaging and canning, including sealing cans of various kinds, can be used and adapted for the purposes described herein, including to make gas tight seals and dry joints from multiple components. See, for example, (1) Brody and Marsh, *Encyclopedia of Packaging Technology*, John Wiley, 1997; (2) Soroka, *Fundamentals of Packaging Technology*, IoPP, 2002. For example, seaming heads and seaming rollers can be used to curl materials around each other and form seams. In addition, pressure rollers can be used to seal materials forming gas-tight seals. In one embodiment, solders, welding, and sealants are not needed or used to form the seal. In one embodiment, multiple layers of metal or other solid materials can be forced against each other sufficiently to provide for sealing. For example, two, three, four, five, or more layers of solids can be forced together to form the seal. Methods, machines, and materials used in the commercial production of sealed cans can be used.

Electrical Feed-Through

The electrical paths through the housing can be created using known technologies for producing a hermetic electrical feed-through in a conductive or non-conductive material. For example, U.S. Pat. No. 5,657,811 discloses a feed-through including an in-situ formed insulator, the disclosure of which is hereby incorporated by reference in its entirety.

Figure 6C:
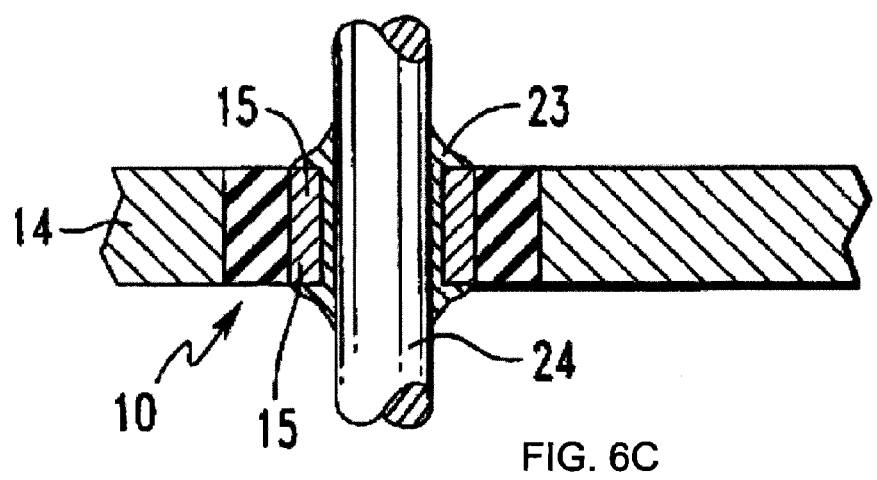

As shown in FIG. 6C, adapted from the '811 patent, an isolated electrical path through a metal housing 14 can be formed by casting or drilling a hole in the housing 14, and then fill the hole with a feed-through. In one embodiment, the feed-through is made through an aluminum housing, and the insulator can be made of aluminum oxides or aluminum nitrides, which bond well with aluminum. A metal pin can be brazed, cemented, or soldered with solder, to a metal ring within the insulator. For example, the feed-through can comprise an electrical conductor 24 inside a metal ring 15 bonded to an insulator 10. The insulator 10 can comprise, for example, aluminum oxide or aluminum nitride. The insulator can be cemented, soldered with solder 23, or fused into the hole. For example, with respect to fusing, a known technology involves disposing a glass frit into the hole, where the glass frit has an aperture through which a conductive pin can be placed. By heating and melting the glass, a hermetic, electrically isolated, electrical feed-through can be formed through the housing or substrate.

Feed-throughs can also be made by use of a ceramic, a plastic, epoxy, or other materials, forming glass-to-metal, ceramic-to-metal, or molded plastic-to-metal seals. The materials forming the feed-throughs typically are required to have substantially matching thermal expansion coefficients over the operating temperature range to maintain the hermetic seals.

In another embodiment, a feed-through can be made using a method disclosed in U.S. Patent Application Pub. No. 20080210455, the disclosure of which is hereby incorporated by reference in its entirety. In this method, the conductor and the insulator can have a plurality of circumferential grooves, and the assembly can be crimped and/or swage-crimped to cause the materials of the components to be displaced or extrude into the grooves creating mechanical interlocks.

In the examples shown in FIGS. 6A-6C, the feed-throughs have relatively smaller surface areas, thus minimizing leakage of water vapor and oxygen through the hermetic seals. The edge portion of the substrate 608 has a much larger area for a potential leakage, which is also minimized by the roll crimp and the multiple sealants.

Continuous and Discrete Active Region

Figure 7A:
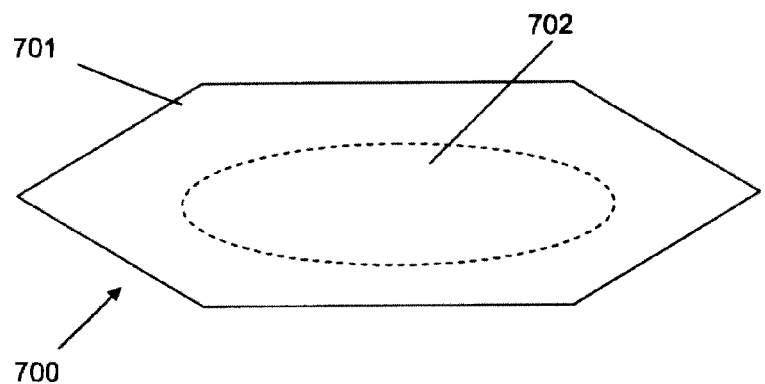
FIG. 7A is a perspective view of an example device with a single, continuous active region.

In the device 700 illustrated in FIG. 7A, as viewed through the transparent substrate 701, the active region 702 is a continuous region forming a single light emitter. Unlike inorganic LEDs which are typically point light sources, the OLED device 700 is an area light sources. The active region can be as very large, e.g., on the order of one meter or larger. The size may be limited by manufacturing processes. Preferably, the active region has a lateral dimension larger than about 0.1 centimeter.

Figure 7B:
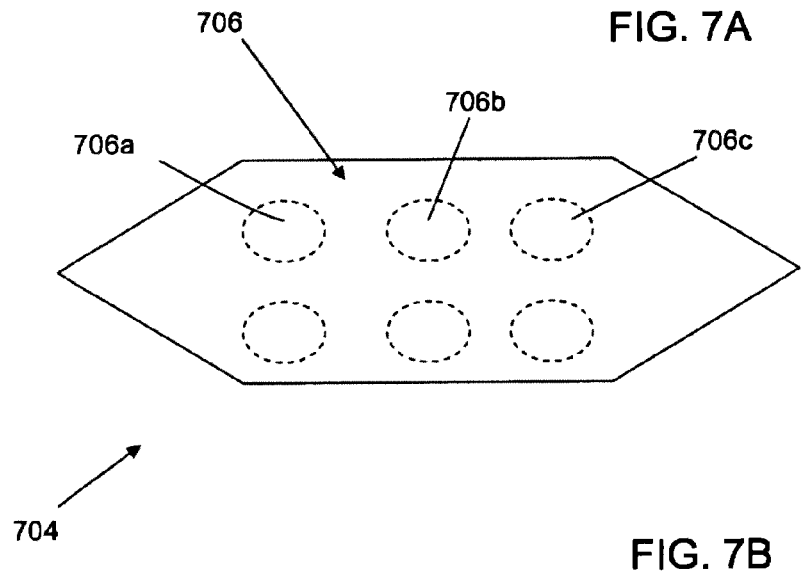
FIG. 7B is a perspective view of an example device with a plurality of active regions.

In another embodiment shown in FIG. 7B, the device 704 has an active region 706 comprising a plurality of discrete light emitters 706a, 706b, 706c, ..., forming a plurality of pixels. The individual pixels may be collectively driven, e.g., through a common anode and a common cathode, and thus illuminate altogether. Alternatively, these pixels may be individually driven through their own anodes and cathodes. In the latter case, multiple electrical paths and hermetic seals may be needed through the housing 708, and a controller may be used to individually or collectively control the pixels.

Figure 7C:
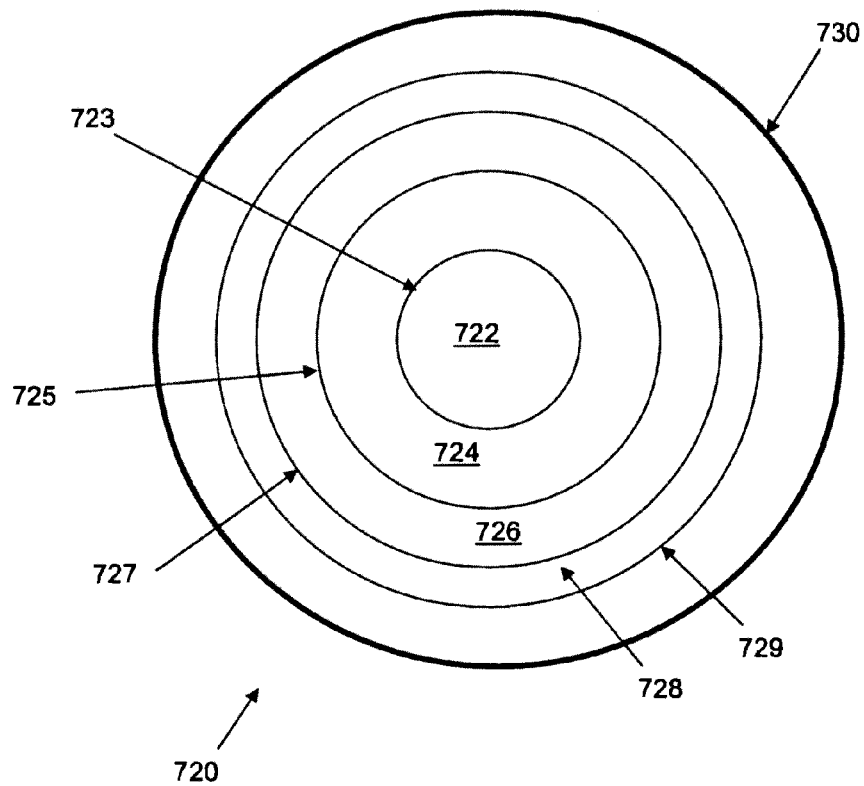
FIG. 7C is a top plan view of a device with a plurality of annular active regions.

In one embodiment shown in the top plan view in FIG. 7C, the device 720 has a plurality active regions 722, 724, 726, 728, ..., separated by trenches or insulators 723, 725, 727, 729, .... The active regions 722, 724, 726, 728, ... each can have substantially annular shape, and can be substantially concentric. These regions can have substantially equal surface areas. For example, the trenches or insulators 723, 725, 727, 729, ... can have gradually increasing pitches. The active regions can each have its own cathode and anode, or can have one common electrode. The active regions can be encapsulated by a circular housing 730, as shown in FIGS. 5A-5D. Alternatively, a polygonal housing can be used.

In the case of an OPV, the device structure shown in FIG. 7C can result in each active region generating a similar voltage as the voltage is proportional to the surface area.

The cathode may be disposed on a transparent substrate. The cathode and the anode may also be substantially transparent such that the device is configured to emit or absorb light in both the cathode and the anode directions. A transparent material selected from a conductive oxide, a metal thin film, or an organic thin film may be used for the transparent cathode or anode.

In some embodiments, at least one of the anode or the cathode comprises a reflective material to reflect light back through the active region, thereby increasing the efficiency of the device.

The lateral dimension d of the active region as shown is larger than about 0.1 centimeter. The lateral dimension d can be as large as possible, but may be limited by manufacturing processes. Typically d is smaller than about 1 meter. Preferably, d is less than a characteristic distance for charge transport, e.g., the distance charges can travel, in the anode. When the anode comprises ITO, d is less than about 10 cm.

Light Coupling

Figure 8A:
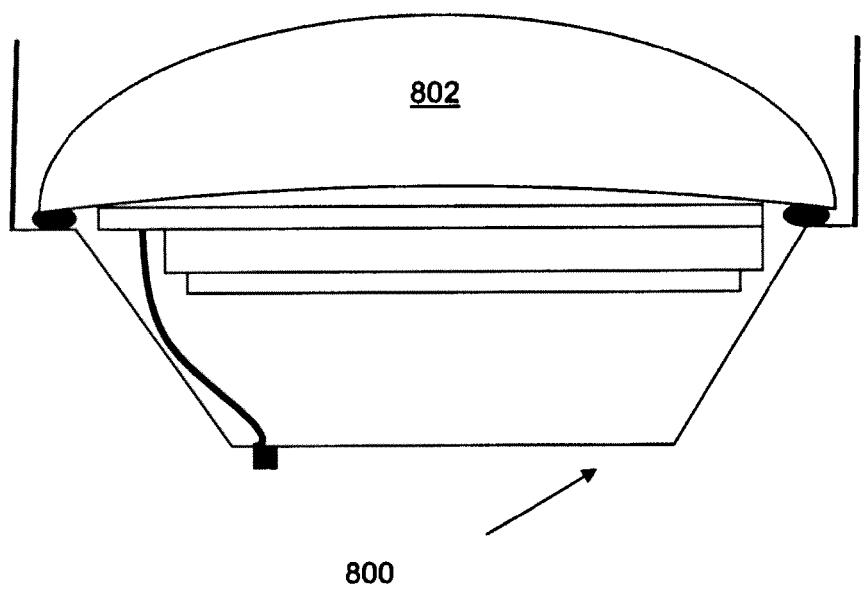
FIGS. 8A and 8B are cross-sectional views of example devices having light coupling layers to improve light coupling efficiency.
Figure 8B:
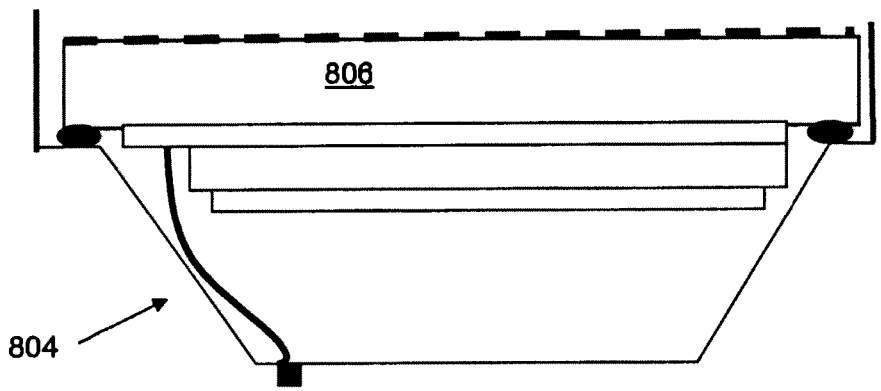

In addition to including layers such as HIL to improve the light emitting efficiency, the OLED device may have an improved light emitting efficiency by improving the light out-coupling efficiency by engineering the optics. In some embodiments, the OLED device includes a light coupling layer configured to improve light out-coupling. For example, as illustrated in FIG. 8A, the OLED device 800 has a substrate 802 with a lens-shaped surface. As shown in FIG. 8B, the OLED device 804 has a substrate 806 with a patterned surface. The patterned surface forms a grating that improves the light out-coupling efficiency and directability. Alternatively, the light coupling layer may comprise a plurality of microlenses, a photonic crystal, a roughened transparent surface, a waveguide, or a low refractive index layer. The low refractive index layer may comprise, for example, an aerogel. The low refractive index layer may reduce the internal reflection in the vertically emitting configuration. U.S. Patent Application Pub. No. 20080061683, the disclosure of which is hereby incorporated by reference in its entirety, discloses a waveguide structure for coupling the light output in a direction substantially normal to the waveguide.

In some embodiments, the light coupling layer is also configured to convert the spectrum emitted by the active region to another spectrum of a longer wavelength. For example, the light coupling layer may comprise a phosphor layer, or a quantum-dot-based film. The phosphor layer or the quantum-dot-based film is configured for down-converting photons of higher energy to lower energy.

An Embodiment

Figure 9:
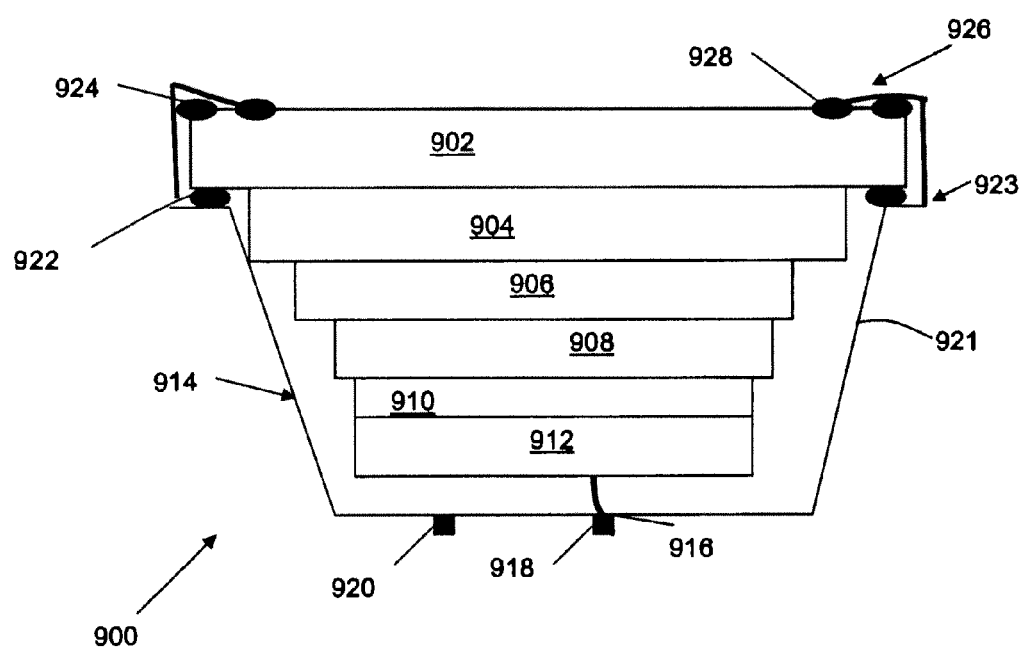
FIG. 9 is a cross-sectional view of an example of a pre-manufactured, modular organic optoelectronic device.

A prophetic example of a pre-manufactured modular OLED device 900 is illustrated in FIG. 9. The geometrical shapes and sizes are exaggerated for clarity, and are not drawn to scale. The OLED device 900 as shown has a lateral dimension of about 1 cm, and has a hexagonal shape in a top plan view as in FIG. 5. When provided in a kit, multiple OLED devices are provided with different sizes, colors, and shapes. The glass substrate 902 is about 1 mm thick. Disposed on the glass substrate 902 is a layer of ITO 904 as the anode, which is about 100 nm thick. A hole injection layer 906, comprising an inherently conductive polymer, is adjacent the anode and is about 200 nm thick. The active region 908 comprises polyphenylene vinylene, and is about 300 nm thick.

A condition layer composed 910 composed of LiF, which may be only a few angstroms thick, is disposed between the active region 908 and the cathode 912 to improve the coupling between the active region 908 and the cathode 912. The cathode 912 comprises an aluminum layer with a thickness of about 100 nm.

The above layers are enclosed in the housing 914. The cathode 912 is electrically coupled, through a hermetic seal 916 on the housing 914, to a first coupler 918. The housing 914 in this embodiment is composed of aluminum, and is electrically coupled to the anode 904. A second coupler 920 is attached to the housing 914, and thus is electrically coupled to the anode 904. The OLED device 900 can thus be readily plugged into corresponding couplers (indentations) on a mount or another OLED device.

In this prophetic example wherein the housing 914 is composed of aluminum, the housing 914 is shaped from aluminum flatstock to have a thickness, composition and temper to permit single or multi-stage stamping or drawing resulting in a "pan" of the desired geometric configuration to accommodate the installation of the OLED devices. The configuration of the pan is made to conform to the OLED device 900 in such a way that the installed device rests on a lip 923 formed into the sidewall 921 of the pan and is of uniform dimension around the circumference of the pan. This lip 920 serves as the first surface to which sealant/adhesive 922 is applied to affect the hermitic encapsulation of the OLED device. The described sidewall 921 shall be of a height to extend above the installed OLED device by not less than the thickness of the OLED substrate to four (4) times the thickness of the OLED substrate.

To the installed and sealed device a continuous bead of a second sealant 924 of the same or of a different composition than the first sealant 922 is applied to the external surface of the device 900 in proximity to the edge of the device and completely around the circumference of the device 900. After application of the second sealant 924, the sidewall 921 is "rolled" or "ironed" over the bead of second sealant 924 to form a "lock" 926 whereby the second sealant 924 is captured beneath the "lock" 926 and thereby retains the layers in the "pan." A third sealant 928 further seals the lock 926. The objective of such a configuration and material combination is to form a torturous path to resist the migration of water and oxygen to the inside of the device cavity.

As shown the aluminum housing ("pan") 914 is further modified to include one or two hermitically sealed electrical contacts 918, 920 on the bottom side of the housing 914 such that the required electrical power for the OLED device can be delivered without jepordizing the hermitic seals. In the case where there is only one electrical contact, the contact may carry the positive charge (+) to the active region 908, and the "pan" itself provides the negative (−) path through contact with other "pans" and eventually to the power supply. Alternatively, the "pan" may be used as a common anode while the contact 918 through the hermetic seal 916 may be coupled to the cathode 912 as shown in FIG. 9.

What is claimed is:

1. A method of manufacturing an organic optoelectronic device, comprising:
    providing a chip comprising a substrate, an anode, a cathode, and an active region including an organic material;
    providing a housing;
    substantially enclosing an edge of the chip with the housing; and
    sealing the chip with the housing using a first barrier material, thereby forming an encapsulation that isolates the active region from an ambient environment,
    further comprising:
    providing a hermetically sealed electrical path through the housing,
    wherein the housing is electrically conductive,
    wherein the electrical path is electrically isolated from the housing, and
    wherein the method further comprises electrically coupling one of the anode and the cathode to the housing.

2. A method of manufacturing an organic optoelectronic device, comprising:
    providing a chip comprising a substrate, an anode, a cathode, and an active region including an organic material;
    providing a housing;
    substantially enclosing an edge of the chip with the housing; and
    sealing the chip with the housing using a first barrier material, thereby forming an encapsulation that isolates the active region from an ambient environment, further comprising:
    providing a hermetically sealed electrical path through the housing,
    wherein the housing is electrically conductive,
    wherein the electrical path is electrically isolated from the housing,
    wherein the method further comprising coupling the anode to the housing, and
    wherein the method further comprises coupling the organic optoelectronic device to a second optoelectronic device such that the electrically conductive housing forms a common anode with an electrically conductive housing of the second optoelectronic device.

* * * * *